(12) United States Patent
Hogg et al.

(10) Patent No.: US 11,050,219 B2
(45) Date of Patent: Jun. 29, 2021

(54) LASER DEVICE AND METHOD FOR ITS OPERATION

(71) Applicant: The University Court of the University of Glasgow, Glasgow (GB)

(72) Inventors: Richard Hogg, Glasgow (GB); David Childs, Glasgow (GB); Richard Taylor, Sheffield (GB)

(73) Assignee: The University Court of the University of Glasgow, Glasgow (GB)

( * ) Notice: Subject to any disclaimer, the term of this patent is extended or adjusted under 35 U.S.C. 154(b) by 0 days.

(21) Appl. No.: 16/097,591

(22) PCT Filed: May 5, 2017

(86) PCT No.: PCT/EP2017/060834
§ 371 (c)(1),
(2) Date: Oct. 29, 2018

(87) PCT Pub. No.: WO2017/191320
PCT Pub. Date: Nov. 9, 2017

(65) Prior Publication Data
US 2019/0165546 A1 May 30, 2019

(30) Foreign Application Priority Data
May 6, 2016 (GB) .................................. 1607996

(51) Int. Cl.
*H01S 5/026* (2006.01)
*H01S 5/187* (2006.01)
(Continued)

(52) U.S. Cl.
CPC .............. *H01S 5/187* (2013.01); *H01S 5/026* (2013.01); *H01S 5/0265* (2013.01);
(Continued)

(58) Field of Classification Search
CPC . H01S 5/187; H01S 5/34; H01S 5/026; H01S 5/141; H01S 5/105; H01S 5/0265;
(Continued)

(56) References Cited

U.S. PATENT DOCUMENTS 6,683,898 B2 * 1/2004 .O slashed.stergaard ................... H01S 5/18355
372/43.01
6,826,223 B1 11/2004 Meyer et al.
(Continued)

FOREIGN PATENT DOCUMENTS

| EP | 1998420 | 12/2008 |
|---|---|---|
| EP | 2023454 | 2/2009 |

(Continued)

OTHER PUBLICATIONS

Matsubara et al. "GaN Photonic-Crystal Surface-Emitting Laser at Blur-Violet Wavelength" Science vol. 319, Jan. 25, 2008, pp. 445-447. (Year: 2008).*

(Continued)

*Primary Examiner* — Tod T Van Roy
*Assistant Examiner* — Delma R. Fordé
(74) *Attorney, Agent, or Firm* — Rudy J. Ng; Bozicevic, Field & Francis LLP

(57) ABSTRACT

A laser device has a photonic crystal surface emitting laser (PCSEL) element. At a first lateral side of the PCSEL element, a reflector is arranged to reflect back into the PCSEL element at least a portion of light travelling out of the PCSEL element through the first lateral side of the PCSEL element. Between the first lateral side of the PCSEL element and the reflector there is interposed an electrically controllable light-transmission region configured to control the transmission of light from the PCSEL element to the (Continued)

reflector, based on an electrical input. Also disclosed is a method of operation of a corresponding laser device.

11 Claims, 15 Drawing Sheets

(51) Int. Cl.
```
H01S 5/14      (2006.01)
H01S 5/18      (2021.01)
H01S 5/065     (2006.01)
H01S 5/34      (2006.01)
```
(52) U.S. Cl.
CPC ............ *H01S 5/0656* (2013.01); *H01S 5/141* (2013.01); *H01S 5/142* (2013.01); *H01S 5/18* (2013.01); *H01S 5/34* (2013.01); *H01S 2301/18* (2013.01)

(58) Field of Classification Search
CPC ...... H01S 5/18; H01S 5/0656; H01S 2301/18; H01S 5/18319
See application file for complete search history.

(56) References Cited

U.S. PATENT DOCUMENTS

| | | | |
|---|---|---|---|
| 6,996,152 B2 | 2/2006 | Vurgaftman et al. | |
| 7,535,943 B2 | 5/2009 | Noda et al. | |
| 7,609,376 B2* | 10/2009 | Wang ........................ | G01J 3/02 356/301 |
| 7,936,801 B2 | 5/2011 | Sakai et al. | |
| 7,978,745 B2 | 7/2011 | Noda et al. | |
| 8,605,769 B2 | 12/2013 | Yoshimoto et al. | |
| 8,711,895 B2 | 4/2014 | Noda et al. | |
| 8,923,358 B2 | 12/2014 | Noda et al. | |
| 9,088,133 B2 | 7/2015 | Noda et al. | |
| 9,281,661 B2* | 3/2016 | Su ........................ | G02F 1/01708 |
| 2004/0135155 A1 | 7/2004 | Otsuka et al. | |
| 2009/0175304 A1 | 7/2009 | Noda et al. | |
| 2009/0285255 A1* | 11/2009 | Sakai ..................... | B82Y 20/00 372/50.124 |
| 2010/0246613 A1 | 9/2010 | Hasegawa | |
| 2013/0243026 A1 | 9/2013 | Noda et al. | |

FOREIGN PATENT DOCUMENTS

| | | |
|---|---|---|
| GB | 2528896 | 10/2016 |
| JP | 2003273456 | 9/2003 |
| JP | 2011176375 | 9/2011 |
| WO | 2009011394 | 9/2009 |
| WO | 2016027105 | 2/2016 |
| WO | 2017191320 | 11/2017 |

OTHER PUBLICATIONS

Taylor et al. "Band structure and waveguide Modelling of epitaxially regrown photonic crystal surface-emitting lasers" Journal of Physics D: Applied Physics, IOP publishing 2013, pp. 1-9. (Year: 2013).*
Noda et al. "Photonic-Crystal Surface-Emitting Laser: Review and Introduction of Modulated-Photonic Crystals" IEEE Journal of selected topic in quantum electronics, vol. 23, No. 6, Nov./Dec. 2017, pp. 1-7. (Year: 2017).*
Taylor et al. "Mode control in Photonic Crystal Surface Emitting Laser through external reflections", IEEE Journal of selected topic in quantum electronics, vol. 23, No. 6, Nov./Dec. 2017, pp. 1-7. (Year: 2017).*
RP Photonics Encyclopedia "Bragg mirrors", pp. 1-5. 2019 (Year: 2019).*
Ieeexplorer.org_Childs.pdf p. 1, Jan. 22, 2020 (Year: 2020).*
Ieeexplorer.org_Hogg.pdf p. 1, Jan. 22, 2020 (Year: 2020).*
Ieeexplorer.org_Taylor.pdf p. 1, Jan. 22, 2020 (Year: 2020).*
Ieeexplorer.org_search.pdf p. 1, Jan. 22, 2020 (Year: 2020).*
Hamed Daliret; al. "High Frequency Modulation of Transverse-Coupled-Cavity VCSELs for Radio Over Fiber Applications", IEEE Photonics Technology Letters, vol. 26, No. 3, Feb. 1, 2014, pp. 281-284. (Year: 2014).*
Hamed Daliretal. "Low Driving Voltage (< 400mVpp) Electro-absorption Modulator Laterally Integrated with VCSEL" Optical Society of America, 2014, pp. 1-3. (Year: 2014).*
John Gelleta et al: "Influence of external reflection on the TE mode of Photonic crystal surface-emitting lasers" Journal of the Optical Society of America—B vol. 32. No. 7. Jul. 1, 2015 (Jul. 1, 2015), pp. 1435-1441 XP055393532.
R. J. E. Taylor et al "Electronic control of coherence in a two-dimensional array of photonic crystal surface emitting lasers", Scientific Reports, vol. 5. No. 1. Aug. 20, 2015 (Aug. 20, 2015), pp. 1-6 XP055393879.
Chassagneux et al. (2009) "Electronically pumped Photonic-crystal terahertz lasers controlled by boundary conditions," Nature, vol. 457 Jan. 8, 2009 pp. 174-178.
Gelleta et al. (2015) "Influence of external reflection on the TE mode of photonic crystal surface-emitting lasers" Journal of the Optical Society of America—B vol. 32. No. 7. Jul. 1, 2015 (Jul. 1, 2015), p. 1435, XP055393532.
Hirose et al. (2014) "Watt-class high-power, high-beam-quality photonic-crystal lasers," Nature Photonics, vol. 8 May 2014 pp. 406-411.
Imada et al. (1999) "Coherent two-dimensional lasing action in surface-emitting laser with triangular-lattice Photonic crystal structure," Applied Physics Letter, vol. 75 No. 3 Jul. 19, 1999 (Jul. 19, 1999) pp. 316-318.
Johnson & Joannopoulos (2001) "Block-iterative frequency-domain methods for Maxwell's equations in a planewave basis," Optics Express vol. 8 No. 3 pp. 173-190.
Kurosaka et al. (2009) "Band structure observation of 2D photonic crystal with various V-shaped air-hole arrangements," IEICE Electronics Express vol. 6 No. 13 pp. 966-971.
Kurosaka et al. (2010) "On-chip beam-steering photonic-crystal laser," Nature photonics, vol. 4 pp. 447-450.
Miyayai et al. (2006) "Laser producing tailored beams," Nature, vol.44 Jun. 22, 2006 p. 946.
Nishimoto et al. (2013) Air Hole Retained Growth by Molecular Beam Epitaxy for Fabricating GaAs-Based Photonic-crystal Lasers, Applied Physics Express, vol. 6 No. 04 4 pages.
Nioda et al. (2001) "Polarization Mode Control of Two-Dimensional Photonic Crystal Laser by Unit Cell Structure Design," Science, vol. 293 Aug. 10, 2001 (Aug. 10, 2001) pp. 1123-1125.
Sakagucgi et al. (2009) "Surface-Emitting Photonic-Cry Laser with 35W Peak Power," 2 pages.
Dhnishi et al. (2004) "Room temperature continuous wave operation of a surface-emitting two-dimensional photonic arystal diode laser," Optics Express, vol. 12 No. 8 Apr. 19, 2004 (Apr. 19, 2004) pp. 1562-1568.
Taylor et al. (2013) "Band Structure and waveguide modelling of epitaxially regrown photonic crystal surface-milting lasers," Journal of Physics D: Applied Physics, vol. 46 264005 8 pages.
Taylor et al. (2013) "All-Semiconductor Photonic Crystal Surface-Emitting Lasers Based on Epitaxial Regrowth," IEEE Journal of Selected Topics in Quantum Electronics, vol. 19 No. 4 Jul./Aug. 2013 4900407 7 pages.
Taylor et al (2015) "Electronic control of coherence in a two-dimensional array of photonic crystal surface emitting lasers", Scientific Reports, vol. 5. No. 1. Aug. 20, 2015 (Aug. 20, 2015), XP055393879.
Taylor et al (2015) "Coherently Coupled Photonic- Crystal Surface-Emitting Laser Array," IEEE Journal of Selected Topics in Quantum Electronics, vol. 21 No., 6 Nov./Dec. 2015 4900307 7 pages.
Yokoyama & Noda (2003) "Polarization Mode Control of Two-Dimensional Photonic Crystal Laser Having a Square Lattice Structure," IEEE Journal of Quantum Electronics vol. 39 No. 9 Sep. 2003 pp. 1074-1080.

(56) References Cited

OTHER PUBLICATIONS

Williams et al. (2012) "Epitaxially Regrown GaAs-Based Photonic Crystal Surface-Emitting Laser," IEEE Photonics Technology Letters, Vol_ 24 No. 11, Jun. 1, 2012 (Jun. 1, 2012 pp. 966-968.
Williams et al. (2012) "Optimisation of Coupling between Photonic Crystal and Active Elements in an Epitaxially Regrown GaAs Based Photonic Crystal Surface Emitting Laser," Japanese Journal of Applied Physics, vol. 51, pp. 0BG05-1-02BG05-3.
GB Search report dated Oct. 14, 2016 5 pages.
International Search Report dated Jul. 26, 2017 15 pages.

\* cited by examiner

LASER DEVICE AND METHOD FOR ITS OPERATION

BACKGROUND TO THE INVENTION

Field of the Invention

The present invention relates to a laser device and a method for its operation. It has particular applicability to a laser device based on a photonic crystal surface emitting laser (PCSEL).

Related Art

Photonic crystal surface emitting lasers (PCSELs) are a new class of semiconductor light emitter. PCSELs have been found to have beneficial properties including coherent oscillation, and low divergences of emitted light.

PCSELs work using an active light emitting layer and a photonic crystal layer. These two layers are arranged near or adjacent to each other as part of a layered structure. The photonic crystal is made of a material having a first refractive index, which is patterned with discrete regions having a second refractive index different from the first refractive index arranged in a periodic lattice structure, thus forming the photonic crystal. The regions having the second refractive index can be holes, or can be filled with another material. The lattice causes Bragg diffraction in the photonic crystal, which in turn causes light to resonate in the photonic crystal at a particular wavelength determined by the periodicity/lattice constant of the photonic crystal.

When a voltage is applied across a PCSEL, the active layer emits light. Light leaks out of the active layer and into the photonic crystal. Light in the photonic crystal having a wavelength coincident with the lattice constant of the photonic crystal resonates in the photonic crystal, and is amplified. This amplified light then leaves the PCSEL through an emission surface.

Gelleta et al. (2015) [15] discloses the results of modelling investigations on the effect of external reflection on the TE mode of PCSELs. The work reported in Gelleta et al (2015) suggests that the use of external reflection may be of interest for improving mode stability in cavities of modest (about 100 μm²) areas. However, no experimental work was presented to support such effects.

SUMMARY OF THE INVENTION

Previous work by the inventors' research group has been published as WO 2016/027105 [20], in which a laser structure is disclosed having a first PCSEL element and a second PCSEL element coupled via a coupling region. The coupling region is electrically controllable in order to provide coherent coupling between the first PCSEL and the second PCSEL.

The present inventors have realised that existing laser devices based on PCSELs may be susceptible of further modification and/or improvement, for example to improve the controllability of the laser output, in terms of intensity, beam divergence, beam shape, etc. The present invention has accordingly been devised. Preferably, the present invention reduces, ameliorates, avoids or overcomes at least one of the above problems. Further advantages of preferred embodiments of the present invention are discussed below.

In a general aspect, the present invention modifies known PCSEL devices by providing controllable and/or selective reflection of laterally propagating light back into the PCSEL.

In a first preferred aspect, the present invention provides a laser device having a photonic crystal surface emitting laser (PCSEL) element, there being provided at least at a first lateral side of the PCSEL element a reflector arranged to reflect back into the PCSEL element at least a portion of light travelling out of the PCSEL element through the first lateral side of the PCSEL element, there being interposed between the first lateral side of the PCSEL element and the reflector an electrically controllable light-transmission region configured to control the transmission of light from the PCSEL element to the reflector, based on an electrical input.

In a second preferred aspect, the present invention provides a method for operating a laser device, the laser device having a photonic crystal surface emitting laser (PCSEL) element, the method including the step of controlling the reflection of light, travelling out of the PCSEL element through a first lateral side of the PCSEL element, back into the PCSEL element, by causing an electrical input to control the transmission of light through a light-transmission region interposed between the first lateral side of the PCSEL element and a reflector.

Accordingly, feedback inside the PCSEL element from light reflected back into the PCSEL element, can be controlled based on the electrical input. The inventors have found that controlling feedback in this way enables the lasing power output and beam shape of the laser device to be controlled electronically. Advantageously, the lasing power output and beam shape can be controlled, if required, without direct modulation of the PCSEL element itself.

In a third preferred aspect, the present invention provides a laser device having a PCSEL element, wherein respective reflectors are provided at least at a first lateral side of the PCSEL element and at a second lateral side of the PCSEL element, each respectively arranged to reflect back into the PCSEL element at least a portion of light travelling out of the PCSEL element through the respective lateral sides of the PCSEL element, wherein the respective reflectors are wavelength-selective.

In a fourth preferred aspect, the present invention provides a method of operating a laser device, the laser device having a photonic crystal surface emitting laser (PCSEL) element, wherein respective wavelength-selective reflectors are provided at least at a first lateral side of the PCSEL element and at a second lateral side of the PCSEL element, the method including the step of emitting light from the PCSEL element through the respective lateral sides of the PCSEL element, the reflectors each respectively being arranged to reflect at least a portion of the light travelling out of the PCSEL element through the respective lateral sides of the PCSEL element, back into the PCSEL element.

As will be understood, a wavelength-selective reflector reflects light depending on its wavelength, typically within a predefined wavelength range about a selected wavelength. Such reflectors can conveniently be formed within the device architecture, e.g. formed by epitaxial and/or lithographic techniques. They therefore provide a convenient format for reflectors which enable feedback of in-plane light back into the PCSEL element. Advantageously, the wavelength-selective reflector may only reflect light at a wavelength corresponding to the resonant frequency of light inside the photonic crystal of the PCSEL element. In other words, the reflector can be made only to reflect light at the lasing frequency of the PCSEL element.

Preferably, the wavelength-selective reflector may reflect substantially all light within the predetermined wavelength range that is incident upon it. Moreover, it may preferably reflect substantially all light corresponding to the lasing frequency of the PCSEL element that is incident upon it.

Accordingly, losses of light at the lasing frequency through the reflector can be minimised, and feedback effects in the PCSEL element can be maximised.

The first, second, third and/or fourth aspect of the invention may have any one or, to the extent that they are compatible, any combination of the following optional features.

The reflector of the first and second aspects may also be a wavelength-selective reflector.

The reflector (and wavelength-selective reflector) may be located in the plane of the PCSEL element.

The electrically controllable light-transmission region may be located in the plane of the PCSEL element.

The electrically controllable light-transmission region may be switchable by the electrical input between a transmission state in which substantially all light is transmitted through it to be reflected by a corresponding reflector, and an extinction state in which substantially no light is transmitted through it, thereby controlling the transmission of light from the PCSEL element to the reflector.

In practice, the transmission may be tunable through a continuous range of optical states, between the extinction state and the transmission state. In this respect, the tuning can be thought of as analog, rather than binary.

Accordingly, when the electrically controllable light-transmission region is in the extinction state, and preventing light from being transmitted to the corresponding reflector, light will not be reflected back into the PCSEL element by the reflector at the corresponding lateral side, and there will be no feedback from that edge of the device. On the other hand, when the electrically controllable light-transmission region is in the transmission state, and allowing light to reach the corresponding reflector, light will be reflected back into the PCSEL element, resulting in feedback from that edge of the device. When the electrically controllable light-transmission region is in an optical state between the extinction state and the transmission state, an intermediate fraction of light will be reflected back into the device by the reflector at the corresponding lateral side.

In the first and second embodiments there may be provided at a second lateral side of the PCSEL element a second reflector arranged to reflect back into the PCSEL element at least a portion of light travelling out of the PCSEL element through the second lateral side of the PCSEL element. Moreover, the second reflector may be provided in addition to the (first) reflector at the first lateral side of the PCSEL element.

There may also be, interposed between the second lateral side of the PCSEL element and the second reflector, a second electrically controllable light-transmission region configured to control the transmission of light from the PCSEL element to the second reflector, based on an electrical input. Moreover, the second electrically controllable light-transmission region may be provided in addition to the (first) electrically controllable light-transmission region interposed between the first reflector and the first lateral side.

The first and second lateral sides may be adjacent to each other.

The inventors have found that feedback from two adjacent lateral sides of a PCSEL element can be of particular use for controlling the beam shape from the PCSEL, and can be used to select a particular lasing mode of the PCSEL (this is discussed in more detail below). It is advantageous to be able to control the feedback from two adjacent lateral sides individually, as will become clear in the detailed description (below).

Respective reflectors may be provided at first, second and third lateral sides of the PCSEL element, each respectively arranged to reflect back into the PCSEL element at least a portion of the light travelling out of the PCSEL element through the respective lateral sides of the PCSEL element.

Alternatively, respective reflectors may be provided at first, second, third and fourth (i.e. preferably all) lateral sides of the PCSEL element, each respectively arranged to reflect back into the PCSEL element at least a portion of the light travelling out of the PCSEL element through the respective lateral sides of the PCSEL element.

In the case of the first and second aspects, there may be an electrically controllable light-transmission region interposed between each respective reflector and lateral side of the laser device.

Each electrically controllable light-transmission region may be independently controlled by a respective electrical input.

Accordingly, reflection at the respective lateral sides of the PCSEL element can be independently controlled. This provides a high degree of electrical control over the feedback, and hence power output and beam shape, of the PCSEL element.

The reflector may be a distributed Bragg reflector (DBR).

At least one electrically controllably light-transmission region may be segmented, each segment configured to control the transmission of a respective portion of light from the PCSEL element to the reflector. Preferably, each electrically controllable light-transmission region may be segmented. In particular, each electrically controllable light-transmission region may be split into at least two segments. In practice, any number of segments may be used. For example, 2, 3, 4, 5 or 6 segments could be used.

Each segment of each electrically controllable light-transmission region may be independently controlled by a respective electrical input. In particular, each segment may be individually controlled to be in either a transmission state or an extinction state.

The inventors consider that such a segmented controllable light-transmission region can provide further control over the lasing power output and beam shape from a PCSEL element. They also consider that such a segmented controllable light-transmission region could be used for beam steering, by changing the position in the plane of the PCSEL element at which the lasing output is centred.

Further optional features of the invention are set out below.

BRIEF DESCRIPTION OF THE DRAWINGS

Embodiments of the invention will now be described by way of example with reference to the accompanying drawings in which.

DETAILED DESCRIPTION OF THE PREFERRED EMBODIMENTS, AND FURTHER OPTIONAL FEATURES OF THE INVENTION

PCSELs have been shown to give continuous wave operation at room temperature [1], [2]. By controlling the design, i.e. periodic structure, of the photonic crystal layer in a PCSEL, it is possible to control lasing properties such as beam shape [3] and polarisation [4]. It is also possible to achieve beam steering in this way [5]. PCSELs can be fabricated through wafer fusion [2], or by epitaxial growth [6], [7], [8], [9], [10].

By fabricating arrays of individual PCSEL elements, high lasing power outputs have been achieved [6], [11], [12], [13]. Changes to the photonic crystal layer in particular have been used to increase lasing power output [14]. The highest power output achieved from a single PCSEL element do date was achieved using epitaxial growth, and a controlled photonic crystal design [6].

Gelletta et al. (2015) [15] investigated the effect of external reflection from a single lateral side of a PCSEL element on the lasing properties of a PCSEL. By varying the phase of the external reflector, they were able to show changes to threshold gain (lasing threshold), and to band frequency. The change to the lasing threshold was dependent on the phase of the reflection surface, and the nature of the change was different for the different resonant frequency modes of the photonic crystal in the PCSEL. There was no investigation into the effect that varying the phase of the reflection surface across the photonic crystal region would have. The work reported in Gelletta et al. (2015) [15] was not based on experimental measurement but instead was based on modelling and analysis.

Chassagneux et al. (2009) [16] showed that including facets (reflection surfaces) at a lateral side of a THz PCSEL with a hexagonal photonic crystal lattice allowed whispering gallery frequency modes and frequency modes, or frequency modes of the photonic crystal, to be alternately selected.

As discussed in more detail below, the present inventors have found that by including a reflection surface to the edge of a PCSEL element, lasing threshold and far-field beam shape of the PCSEL element can be changed. The refection surface can be considered as having a random phase with respect to the photonic crystal layer. The reflection phase varies across the PCSEL element.

Figure 1:
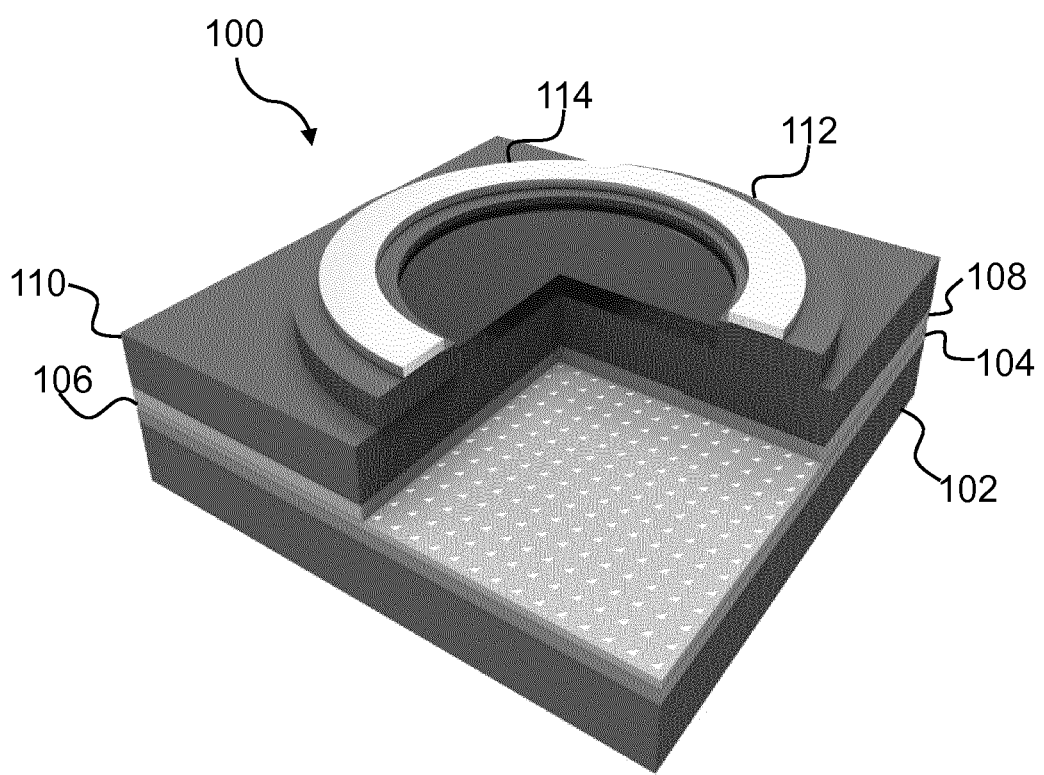
FIG. 1 shows a perspective view of a PCSEL element.
Figure 2:
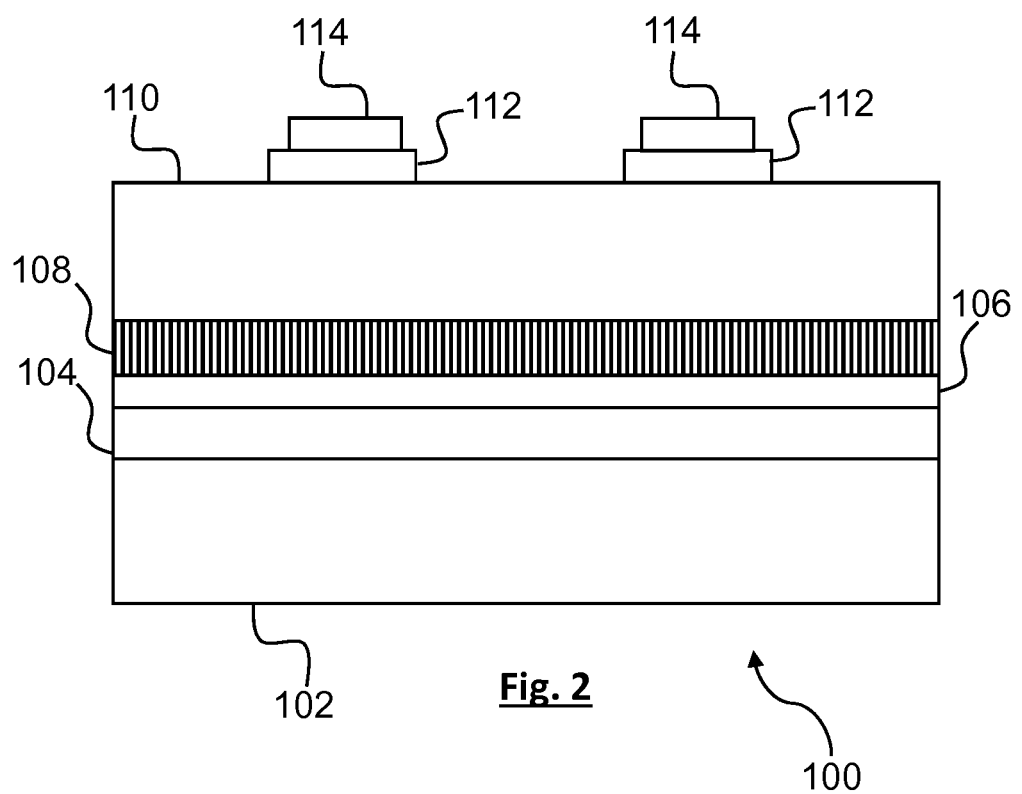
FIG. 2 shows a cross-sectional view of the PCSEL element of FIG. 1.

FIGS. 1 and 2 respectively show a perspective view and a cross-sectional view of a PCSEL element. The PCSEL element of FIGS. 1 and 2 can be grown by metalorganic vapour phase epitaxy (MOVPE) onto a GaAs substrate, for example.

The PCSEL element of FIGS. 1 and 2 has an n-AlGaAs lower cladding layer 102, InGaAs active layer 104, p-InGa etch stop layer 106, InGaP photonic crystal layer 108, p-AlGaAs upper cladding layer 110, p+GaAs cap layer 112, and ring electrode 114. Typically a contact electrode would also be provided adjacent to the lower cladding layer 102. As shown in FIG. 1, the contact electrode is annular, with an aperture through which light can be extracted when the PCSEL is lasing.

The active layer may contain quantum wells and/or quantum dots. For example, it may contain one or more of InGaAs/GaAs quantum wells, InAs/GaAs quantum dots, GaAs/AlGaAs quantum wells, and AlInGaAsP quantum wells. The active layer may be an undoped GaAs/InGaAs triple quantum well core containing 38 nm InGaAs quantum wells with 20 nm GaAs barriers.

The photonic crystal is formed by patterning the InGaP layer with periodic regions having a second refractive index which is different from the first refractive index of the InGaP, thus forming the periodic lattice structure of the photonic crystal. The patterning is done using electron beam lithography (EBL). In particular, holes are patterned in a $SiO_2$ hard mask, and the pattern is transferred into the InGaP by $CH_4/H_2/O_2$ reactive ion etching (RIE). The regions having the second refractive index InGaP may be left as air gaps/voids, or can alternatively be filled by overgrowth with a suitable filler material having a second refractive index, such as GaAs.

The photonic crystal has a footprint size in the plane of the PCSEL element of 150 μm×150 μm. As will be understood, different embodiments may use different dimensions.

The photonic crystal may alternatively, or additionally, comprise one or more of AlGaAs, GaInAs, GaInAsP, AlInGaAs, and AlInGaN.

Figure 3:
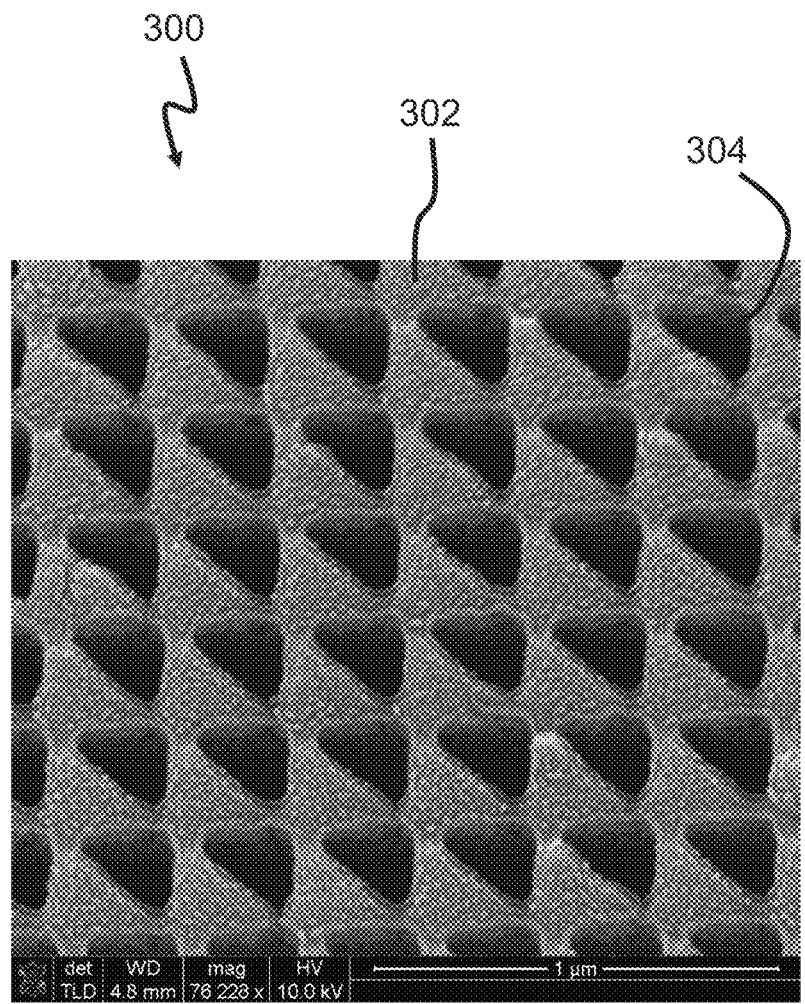
FIG. 3 shows a plan view of a photonic crystal for use in the PCSEL element of FIGS. 1 and 2.

An SEM image of the periodic lattice 300 of the photonic crystal of the PCSEL element is shown in FIG. 3. The light regions 302 are InGaP having the first refractive index discussed above, and the dark regions 304 are filled with GaAs having the second refractive index discussed above. As can be clearly seen from FIG. 3, the dark GaAs regions having the second refractive index each have a triangular shape, and are collectively arranged in a square lattice.

This type of photonic crystal is found to be of particular use for generating high lasing power outputs. As the skilled person will understand, other photonic crystal structures as are known in the art could equally be used. For example, the regions having the second refractive index may have square, circular, or other shapes, and may be collectively arranged in a square, hexagonal, or other lattice arrangement.

The PCSEL element having the above structure has been shown to operate at room temperature under continuous wave condition.

Figure 4:
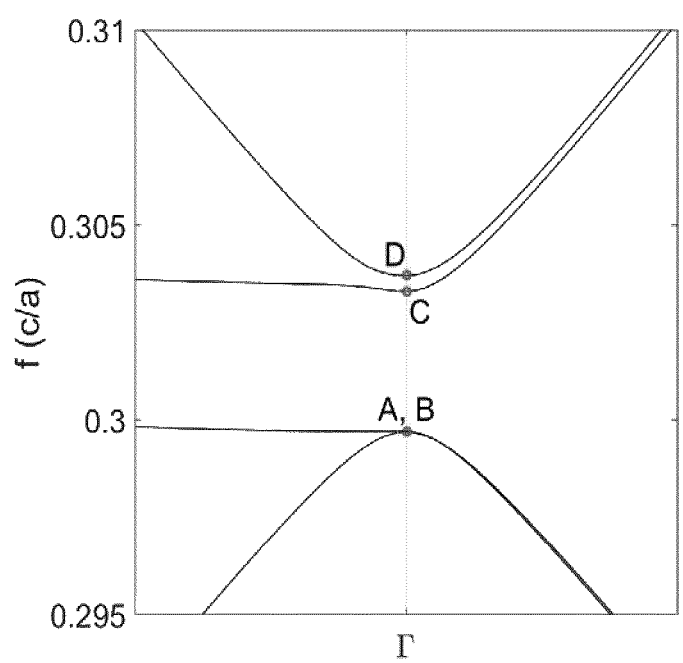
FIG. 4 is a graph of normalised frequency (y-axis) as a function of wave vector (x-axis), showing the photonic band structure of the photonic crystal of FIG. 3.
Figure 5A:
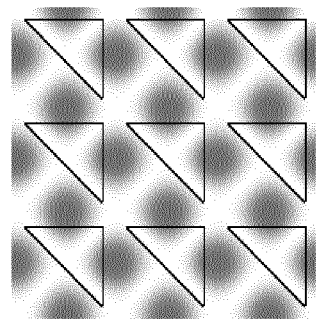
FIGS. 5A to 5D show the modulus of the magnetic field distribution in the PCSEL element of FIG. 3, for the frequencies A, B, C and D shown in FIG. 4.
Figure 5B:
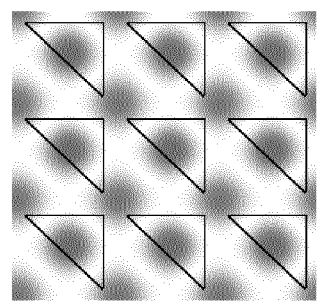
Figure 5C:
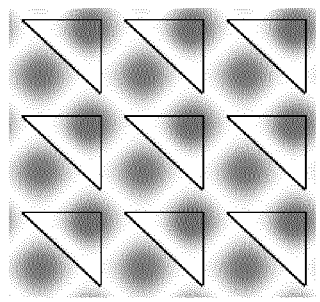
Figure 5D:
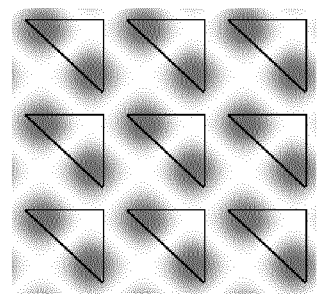

FIG. 4 shows the theoretical photonic band structure about the gamma point (Γ) of the InGaP/GaAs photonic structure of FIG. 3. FIG. 4 was obtained by computer modelling, by solving the definite frequency eigenstates of Maxwell's equations. The simulation was run using MIT photonic bands (MPB) [18]. The frequency (x-axis) in FIG. 4 is normalized by multiplying frequency by a/c, where a=lattice constant, and c=speed of light. Γ is the point at which the group velocity of the light in the photonic crystal is zero, and hence represents the point at which resonance occurs in the photonic crystal. Hence, FIG. 4 shows the four frequencies (A, B, C and D) at which light can resonate in a photonic crystal of FIG. 3.

FIGS. 5A, 5B, 5C and 5D show the theoretical modulus of the magnetic field distribution of transverse-electric (TE) polarized waves in the photonic crystal of FIG. 3, for the four resonant frequencies A, B, C and D (respectively) shown by FIG. 4.

In the PCSEL described above, A and B lasing modes were observed in practice.

The periodic lattice causes Bragg diffraction of light travelling in the photonic crystal to occur. This Bragg diffraction in turn causes light of a specific frequency to resonate, and hence become amplified, in the photonic crystal. Resonance occurs when the group velocity of light propagating in the photonic crystal approaches zero. The frequency at which light resonates in the crystal will depend on the periodicity/lattice constant of the photonic crystal. This resonant frequency will be the lasing frequency of the PCSEL element.

When a voltage is applied across the PCSEL element, the active layer will emit light. This light enters the photonic crystal, and resonates at a given frequency as discussed above to produce laser light. This laser light is then extracted through the emission surface of the PCSEL element (upper cladding layer 110).

Not all light produced by the laser will be extracted through the laser emission surface. Some light travelling in the plane of the PCSEL element will be transmitted through the lateral sides of the PCSEL element.

The inventors have found that by reflecting light back into a PCSEL element from a lateral side of the PCSEL element, thereby changing the feedback inside the PCSEL element, the lasing power and beam shape of the PCSEL element can be changed.

To demonstrate this effect, the inventors used a PCSEL element having a 1.5 μm $Al_{0.4}Ga_{0.6}As$ lower cladding layer, 3 μm quantum well active region (8 nm $In_{0.2}Ga_{0.8}As$ quantum wells separated by 20 nm GaAs layers), 40 nm p-$In_{0.48}Ga_{0.52}$ etch stop layer, 150 nm $In_{0.48}Ga_{0.52}P$ photonic crystal layer (patterned using EBL, with GaAs used to fill the holes in the photonic crystal), 1.5 μm p-$Al_{0.4}Ga_{0.6}As$ upper cladding layer, and a 400 nm $p^+$GaAs cap layer. The photonic crystal has the same lattice structure as is shown in FIG. 3, and has a square footprint in the plane of the device of 150 μm×150 μm. An annular contact electrode with an aperture size of 52 μm was formed on the top cap layer.

The lasing power, beam shape and emission spectra were first measured for the pristine PCSEL element (i.e. without any reflection surfaces). Next, the substrate on which the PCSEL element was grown was cleaved along a first lateral side of the PCSEL element, so as to introduce a first reflection surface at the first lateral side of the PCSEL element. Lasing power and far-field beam shape were measured. Then, the substrate was cleaved along a second lateral side of the PCSEL element, adjacent to the first lateral side, so as to introduce a second reflection surface adjacent to the first reflection surface of the PCSEL element. Lasing power and far-field beam shape were measured again. The results are shown in FIGS. 6, 8A to 8C, and 9A to 9C.

The inventors found that adding at least one reflection surface resulted in a single lasing mode (A or B) being selected.

Figure 6:
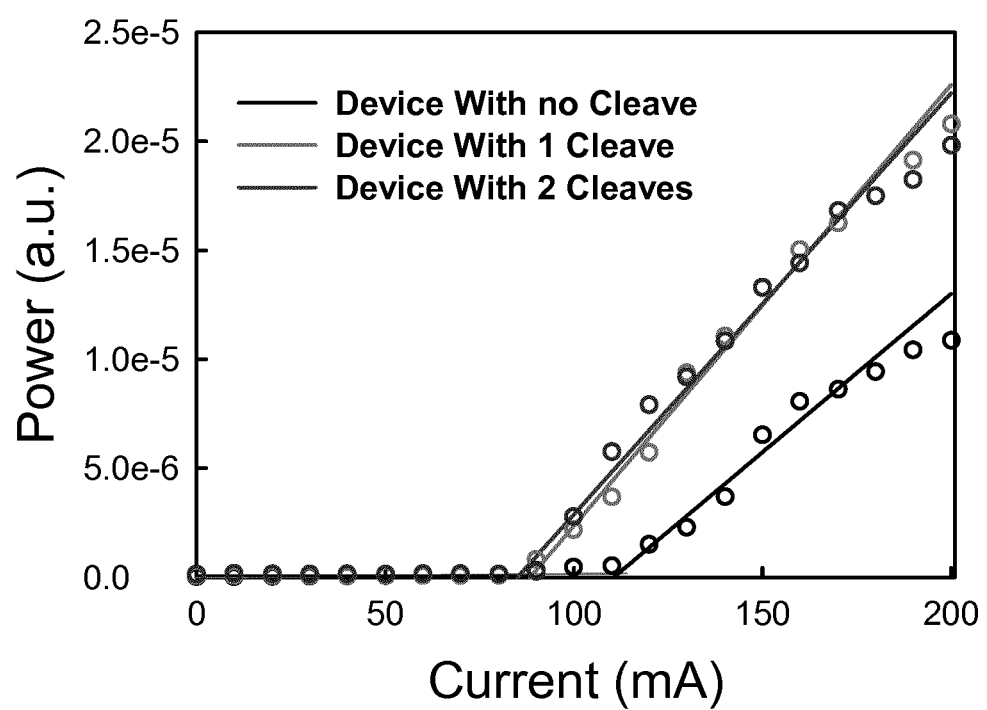
FIG. 6 shows a graph of lasing power (y-axis) as a function of current (x-axis) for PCSELs with different numbers of reflection surfaces.

FIG. 6 is a graph of lasing power (y-axis) as a function of applied current (x-axis). The lasing power from 0-200 mA was measured. As can be seen from the graph of FIG. 6, the lasing threshold of the pristine PCSEL element was 112 mA, and the lasing power at 200 mA was about $1 \times 10^{-5}$ a.u. (arbitrary units).

The lasing power of the PCSEL element with a single reflection surface was then measured from 0-200 mA. As can be seen from the graph of FIG. 6, the single reflection surface reduced the lasing threshold to 88 mA. The lasing power at 200 mA was increased to about $2 \times 10^{-5}$ a.u.

The lasing power of the PCSEL element with two reflection surfaces was then measured from 0-200 mA. As can be seen from the graph of FIG. 6, the lasing power and lasing threshold were not particularly altered by adding the second reflection surface compared with having only one reflection surface.

The experimental results of FIG. 6 show that adding a reflection surface at a lateral side of a PCSEL element increases lasing power, and reduces the lasing threshold.

Figure 7:
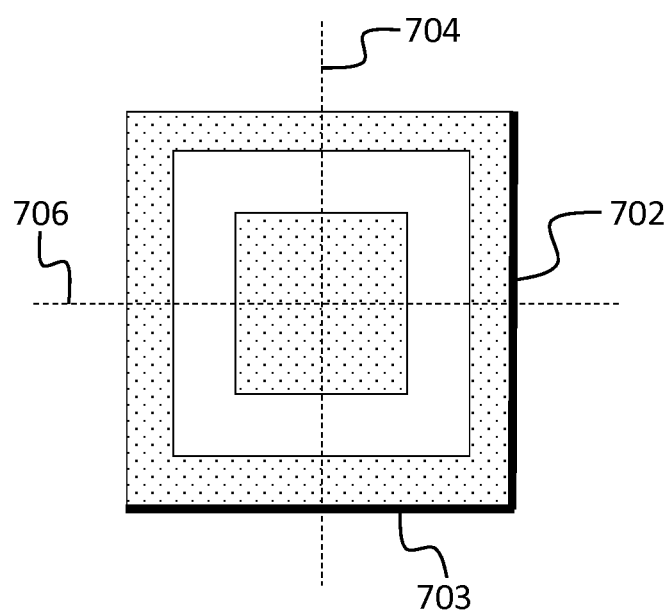
FIG. 7 shows the orientation of the 0° and 90° directions of FIG. 8.

FIG. 7 shows the location of the first cleave/reflection surface 702 and the second cleave/reflection surface 703 relative to the PCSEL element.

Figure 8A:
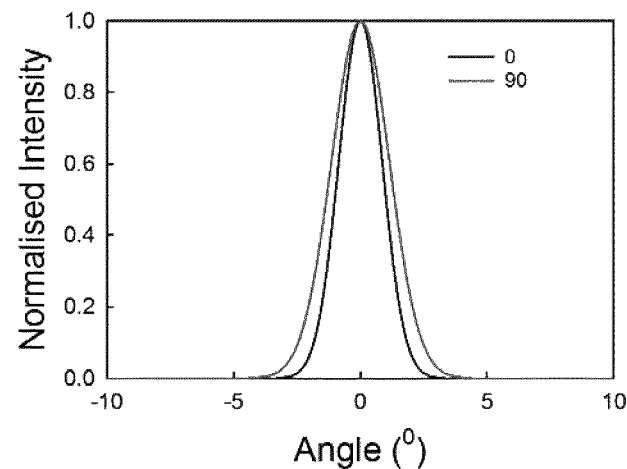
FIGS. 8A to 8C are graphs of normalized beam intensity (y-axis) as a function of angle (x-axis) for PCSELs operated at 1.1× threshold current, and with different numbers of reflection surfaces
Figure 8B:
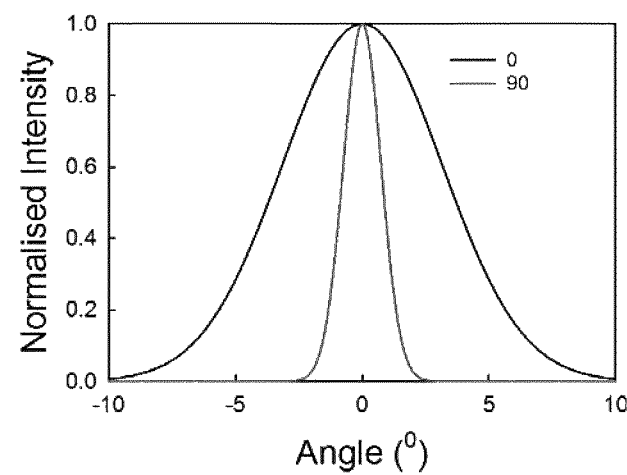
Figure 8C:
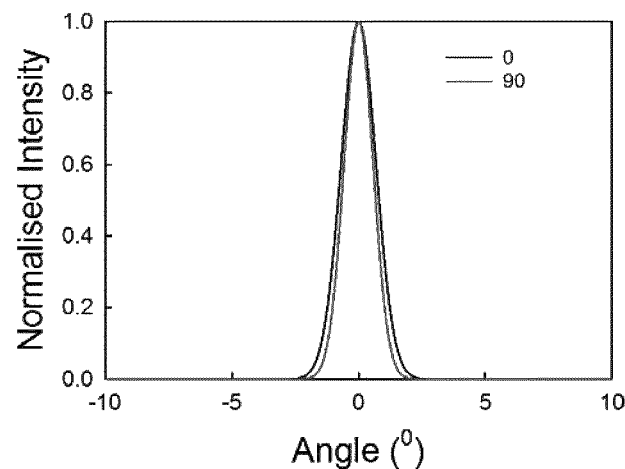

FIGS. 8A to 8C show beam distribution graphs of normalised intensity against angle for far-field measurements of light emitted through the emission surface of the PCSEL element of FIGS. 1 and 2, at an operating current of 1.1× threshold current, and with different numbers of reflection surfaces.

In FIGS. 8A to 8C, the 0° line is beam intensity as a function of angle parallel to the reflection surface. That is, the 0° line shows how beam intensity varies as a function of angle along line 704 in FIG. 7 (where line 702 is the reflection surface). The 90° line shows how beam intensity as a function of angle perpendicular to the reflection surface. That is, the 90° line shows how beam intensity varies as a function of angle along line 706 in FIG. 7. The zero degrees point on the x-axis in FIGS. 8A to 8C corresponds to a viewing position along an axis passing through the point at which the lines 704 and 706 of FIG. 7 intersect, the axis being perpendicular to the plane of the PCSEL element.

FIG. 8A is the far-field beam distribution for the PCSEL element with no reflection surfaces. As can be seen from the figure, the beam shape is approximately circular, and has an angular spread of approximately ±2.5°.

FIG. 8B is the far-field beam distribution for a PCSEL element with a single reflection surface. As can be seen from FIG. 8B, a single reflection surface has the effect of widening the beam in the direction parallel to the reflection surface, and concentrating the beam in the direction perpendicular to the reflection surface. The angular spread in the direction perpendicular to the reflection surface was decreased slightly, to about ±2°, whilst the angular spread in the direction parallel to the reflection surface was increased to about ±10°.

FIG. 8C is the far-field beam distribution for a PCSEL element with a single reflection surface. As can be seen from this figure, the addition of a second reflection surface adjacent to the first reflection surface has the effect of concentrating the beam in the direction parallel to the first reflection surface, such that the beam is concentrated in both directions when compared with the PCSEL element without any reflection surfaces, with an angular spread of approximately ±1°.

Hence, the addition of a single reflection surface at a lateral side of the PCSEL element creates a beam with an oval shape. The addition of two reflection surfaces, at adjacent lateral sides of the PCSEL element, has the effect of reducing the angular spread of the beam when compared with the PCSEL element with no reflection surfaces.

Figure 10:
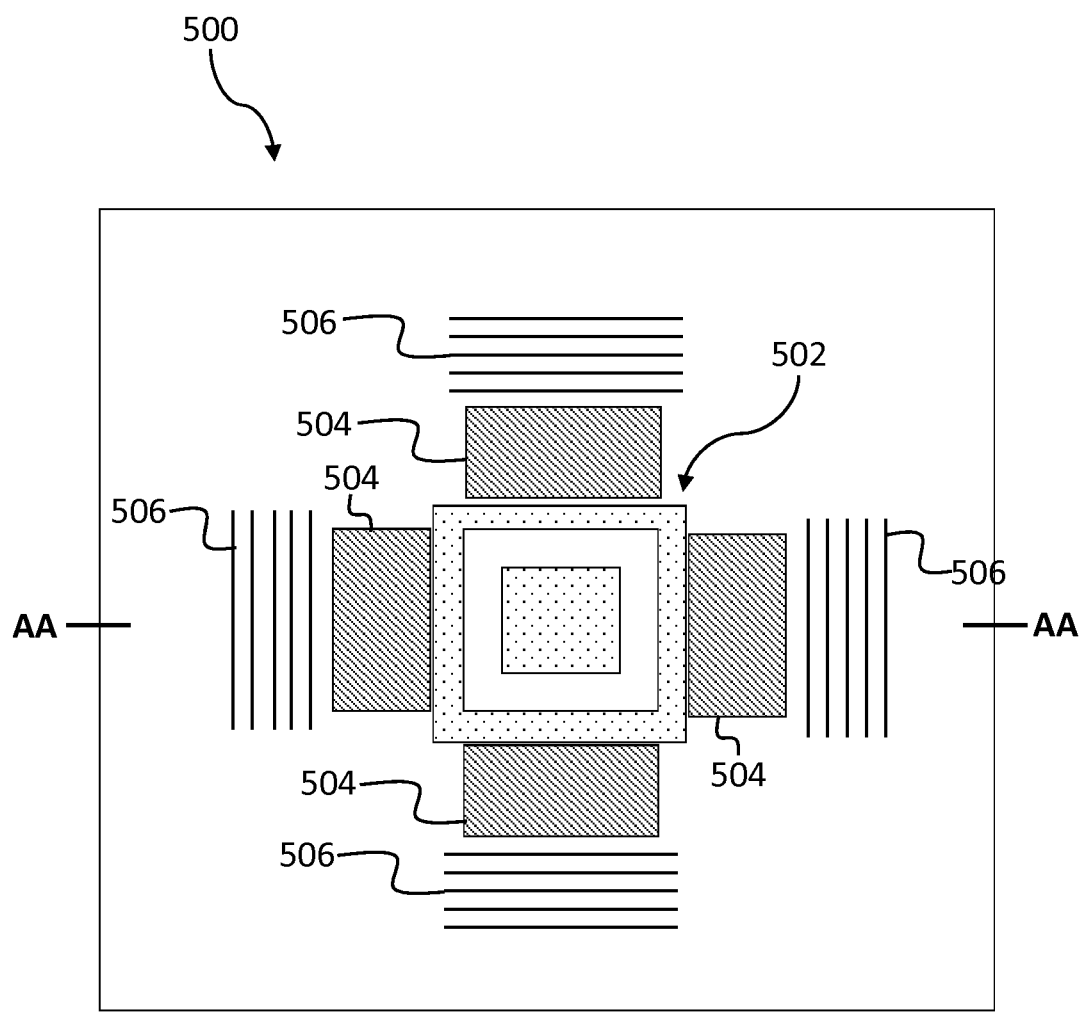
FIG. 10 shows a plan view of a laser device according to an embodiment of the present invention.

Based on the above findings, the inventors have developed a laser device in which lasing power and beam shape can be changed electronically. Such a laser device is shown in FIG. 10.

Figure 9A:
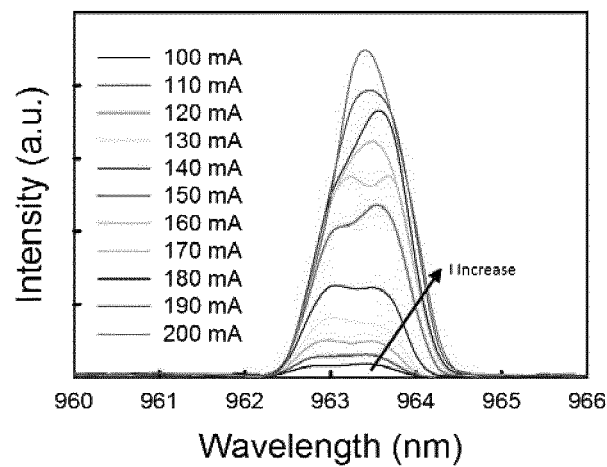
FIGS. 9A to 9C show graphs of beam intensity (y-axis) as a function of emission wavelength for PCSELs operated at a range of currents, and with different numbers of reflection surfaces.
Figure 9B:
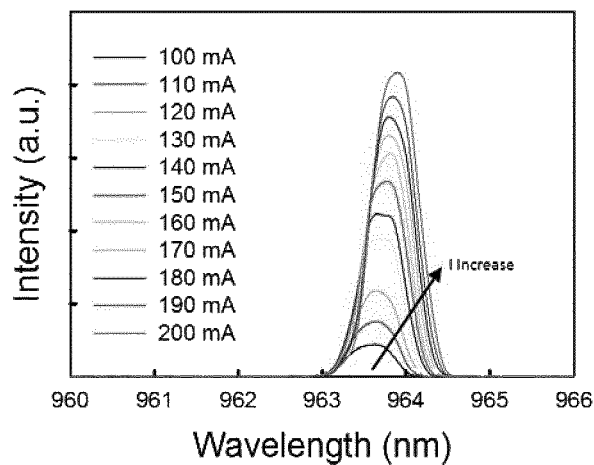
Figure 9C:
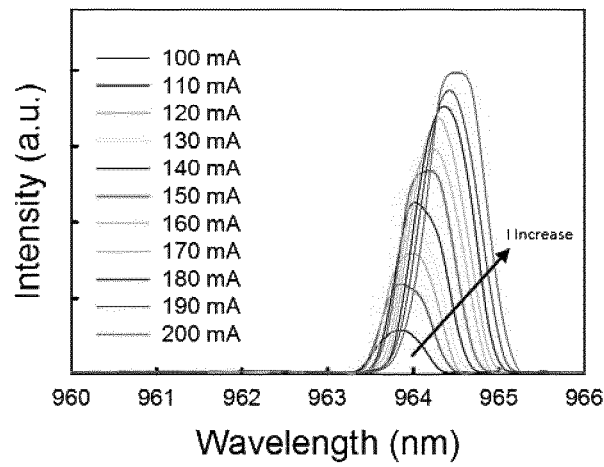

FIGS. 9A to 9C show graphs of beam intensity as a function of emission wavelength for the PCSEL element of FIGS. 1 and 2, when operated at a range of currents, and with different numbers of reflection surfaces.

FIG. 9A shows beam intensity as a function of emission wavelength for the pristine PCSEL element with no reflection surfaces. As can be seen from FIG. 9A, the pristine PCSEL element has a tendency to have two spectral maxima at lower current values.

FIG. 9B shows beam intensity as a function of emission wavelength for the PCSEL element with a first reflection surface. As can be seen from FIG. 9B, the addition of a single reflection surface results in a single spectral emission peak, which is centred at approximately 63.5 nm.

FIG. 9C shows beam intensity as a function of emission wavelength for the PCSEL element with a second reflection surface adjacent to the first reflection surface. As can be seen from FIG. 9C, the PCSEL element still has a single spectral emission peak. The emission maxima can be seen to increase as a function of current. The inventors consider that this increased maxima is a result heating effects caused by current confinement in the PCSEL element with two cleaves.

The laser device 500 of FIG. 10 includes a PCSEL element 502. This PCSEL element 502 in this embodiment has the same structure as the PCSEL element 100 of FIGS. 1 and 2. A controllable light-transmission region 504 and a DBR reflector 506 are formed at each lateral side of the PCSEL element 502. The controllable light-transmission region at each lateral side is interposed between the PCSEL element and the respective DBR reflector. This forms the laser device.

Each DBR reflector 506 is configured to reflect light which is incident upon it and travelling in a direction substantially parallel to the plane of the PCSEL element 502. The DBR reflectors exist in the plane of the PCSEL element. In this way, light travelling out of the PCSEL element 502 can be reflected back into the PCSEL element 502 by a DBR reflector 506, thereby altering the feedback within the PCSEL element.

The optical properties of each controllable light-transmission region 504 are controllable by an electrical input. In particular, by controlling a current supplied to a given controllable light-transmission region 504, the optical properties of the controllable light-transmission region 504 can be controlled. In particular, the optical properties of the controllable light-transmission region can be controlled to be anywhere between a transmission state, in which substantially all light is transmitted, and an extinction state, in which substantially no light is transmitted. Preferably, it is switched between the transmission and extinction states. Moreover, the controllable light-transmission region is controlled by passing a current through it. When this current exceeds a threshold value, the contact is essentially transparent, allowing light to pass through it. This is the transmission state. When the current is below the threshold value, the contact no longer allows light to pass through it. This is the extinction state.

When controlled to be in the transmission state, the controllable light-transmission region 504 will transmit light travelling out of the PCSEL element 502 in the plane of the PCSEL element. This light will then be reflected by the corresponding DBR reflector 506, and back into the PCSEL element 502. Conversely, when the controllable light-transmission region is controlled to be in the extinction state, light will not be reflected back into the PCSEL element 502. Accordingly, the feedback from each lateral side of the PCSEL element can be electronically controlled.

As has been shown in relation to FIGS. 6, 8A to 8C and 9A to 9C above, by selectively controlling whether light is reflected back from specific lateral sides of the PCSEL element, the power output and beam shape of the laser device can be altered. Hence, the laser device 500 enables the lasing power and beam shape to be altered electronically.

For example, by controlling the controllable light-transmission regions 504 so a first controllable light-transmission region is in a transmission state and the other three are in an extinction state, the lasing threshold can be reduced, and the lasing power at a given operating current above the lasing threshold can be increased. Furthermore, the beam can be made to have an oval shape. By controlling two adjacent controllable light-transmission regions 504 to be in the transmission state, and controlling the other two to be in the extinction state, the laser beam from the laser device 500 can be concentrated.

Figure 11:
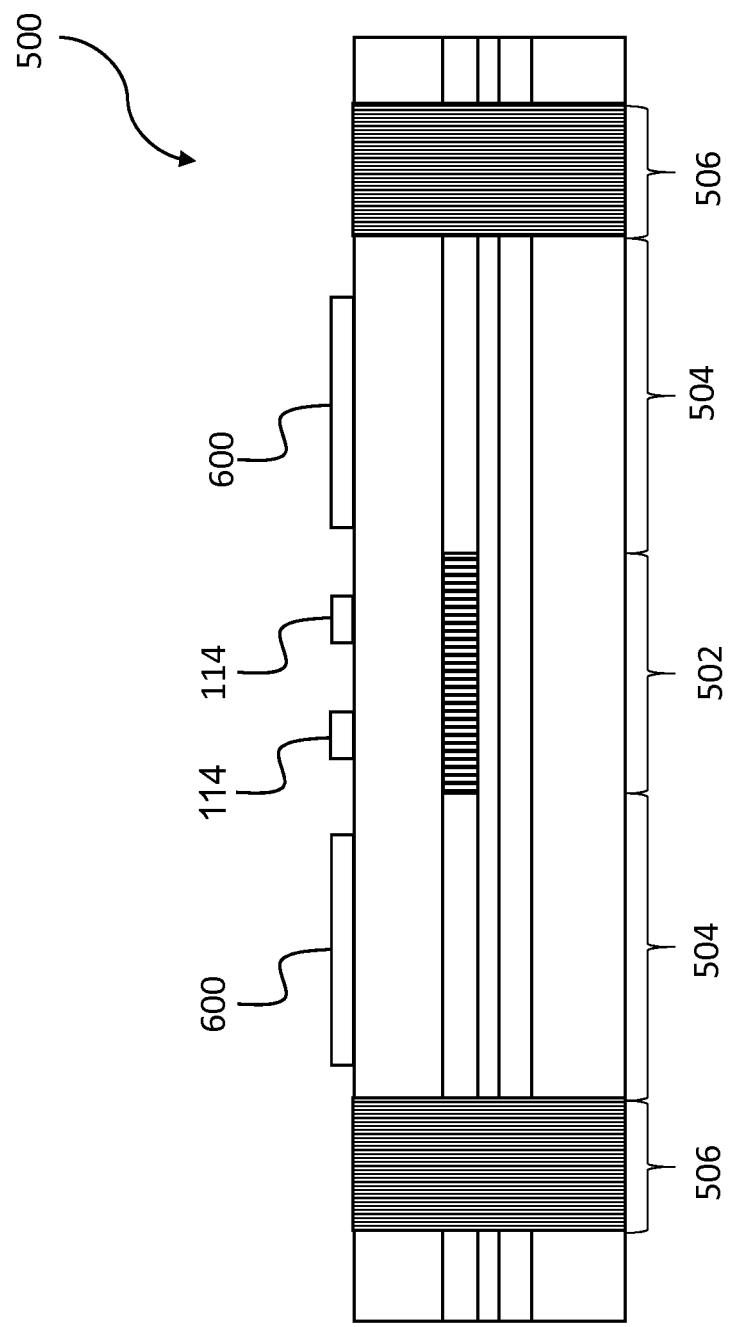
FIG. 11 shows a cross-sectional view of the laser device of FIG. 10, viewed along line AA-AA.

FIG. 11 shows the laser device 500 viewed along line AA-AA. As can be seen from FIG. 11, the PCSEL element 502 has the same structure as the PCSEL element from FIGS. 1 and 2.

The controllable light-transmission regions 504 have the same layered structure as the PCSEL element. Accordingly, the controllable light-transmission regions 504 have substantially the same refractive index as the PCSEL element 502, thereby preventing reflection from occurring at the interface between the PCSEL element 502 and the controllable light-transmission regions 504. However, the InGaP layer of the controllable light-transmission regions 504 (corresponding to the photonic crystal layer 108 of the PCSEL element) is not patterned with periodic regions having a different refractive index from the InGaP. This layer is therefore not a photonic crystal in the controllable light-transmission regions 504. The controllable light-transmission regions 504 have their own electrodes 600, which are electrically isolated from the PCSEL element electrodes 114.

As such, the controllable light-transmission regions 504 can be controlled electronically, independently of each other, and independently of the PCSEL element 114.

The PCSEL element 502, controllable light-transmission regions 504 and DBR reflector 506 all exist in the same plane, so as to selectively reflect light travelling out of the PCSEL element in the plane of the laser device, based on a current supplied to the optically tunable region(s) 504.

In some embodiments, several laser devices may be grown on a single substrate. This substrate will then be cleaved after the fabrication process, thereby providing a plurality of individual laser devices, each laser device containing a single PCSEL element.

Figure 12:
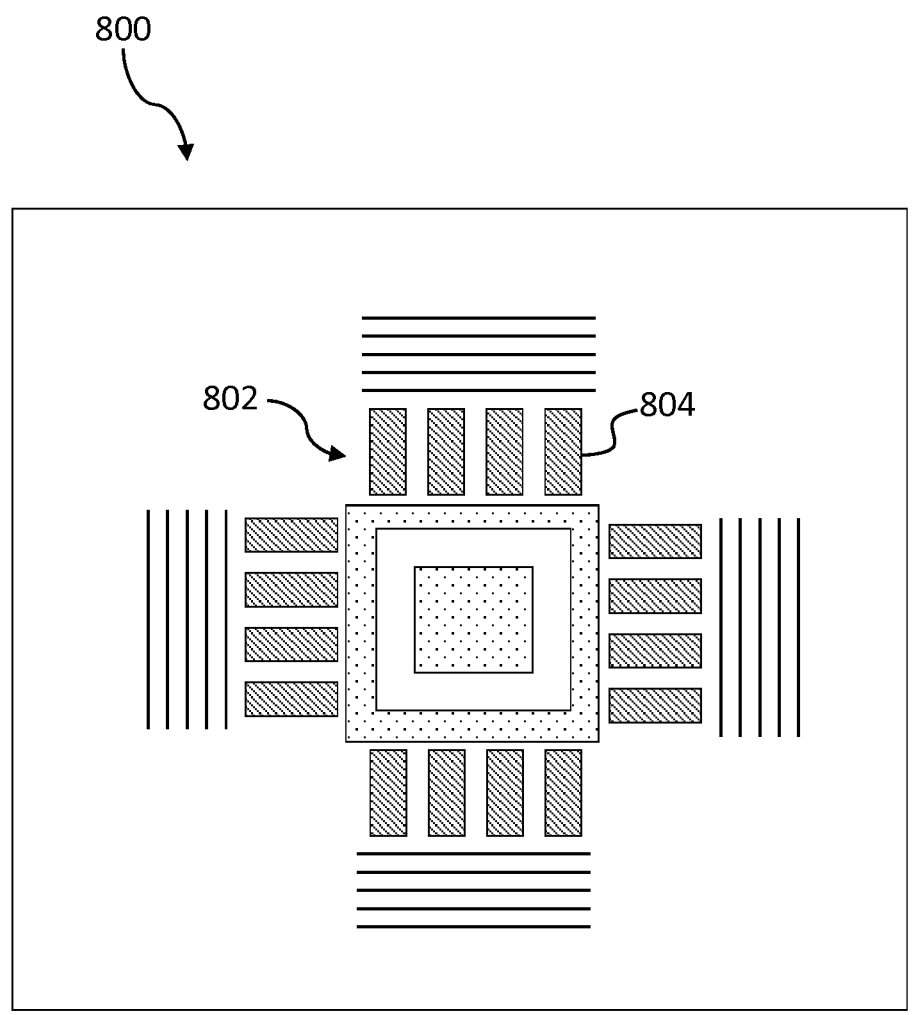
FIG. 12 shows a plan view of a laser device according to another embodiment of the present invention.

FIG. 12 shows a modification to the laser device of FIGS. 10 and 11. In this laser device 800, each controllable light-transmission region 802 is segmented into a plurality of optically tunable segments 804. Each segments 804 may be controlled independently from the other segments. Accordingly, each individual segment can be independently controlled to be in either a transmission state or an extinction state. As such, the feedback from a given lateral side can be modulated. For example, by having a single segment at a lateral side in the transmission state, and the other segments in the extinction state, the lateral side can be made to provide weak feedback to the PCSEL element.

This ability to fine-tune the feedback at each lateral side can enable the emission intensity of the laser device to be fine-tuned, with a higher level of control than by uniformly controlling feedback from an entire lateral side, as in the embodiment of FIGS. 10 and 11.

Furthermore, by spatially modulating the feedback from each lateral side, the beam shape can more accurately be controlled. Hence, segmented electrodes can be used to steer the laser beam, as well as adjust its shape and angular divergence.

Figure 13:
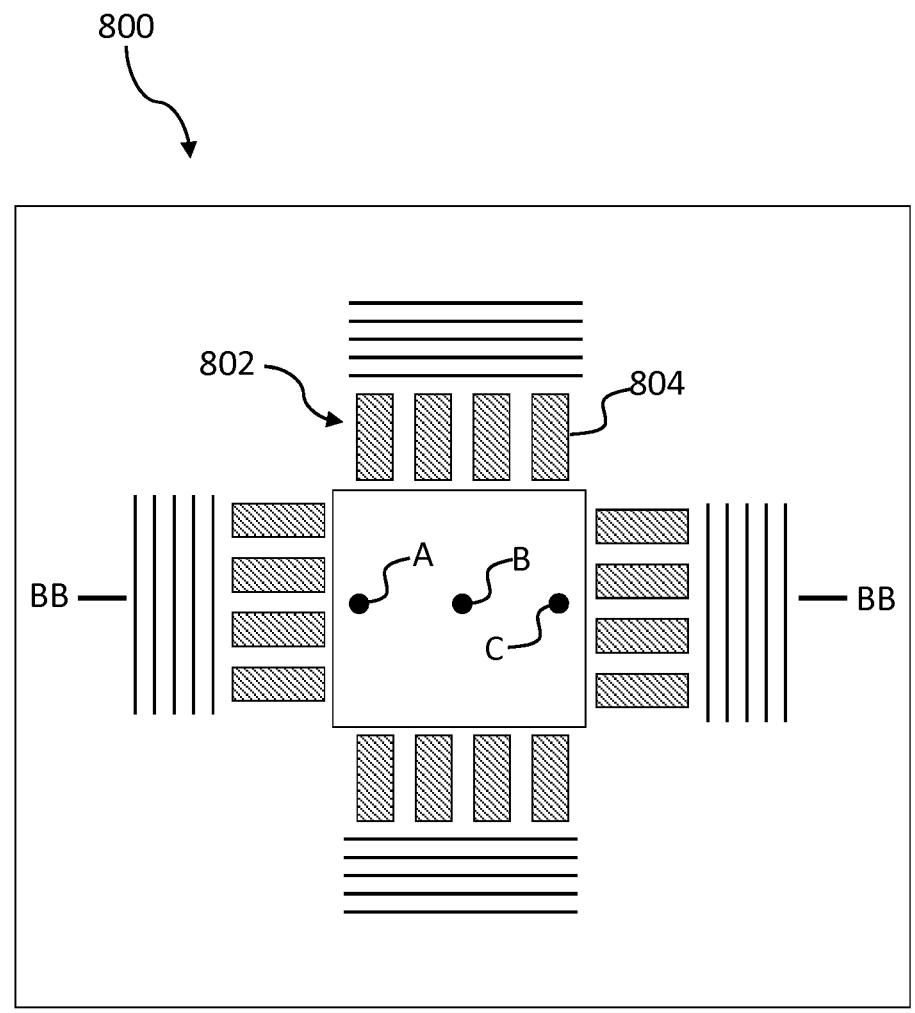
FIG. 13 shows examples of centred lasing emission points (A, B, C) for the laser device of FIG. 12.
Figure 14:
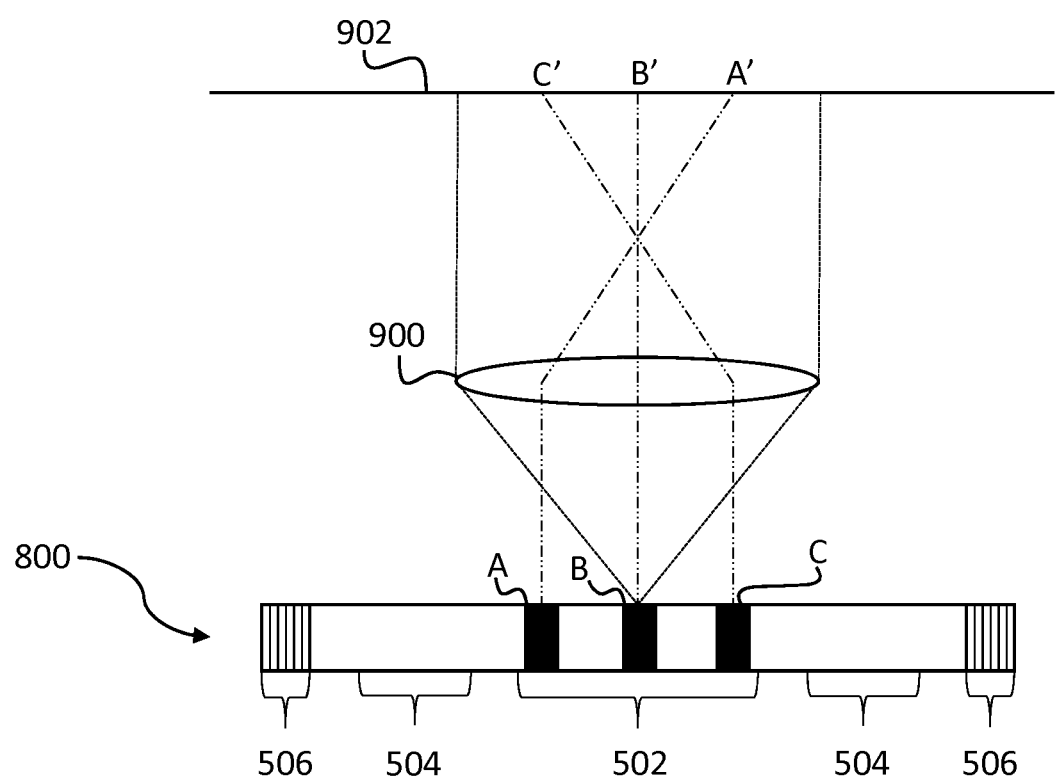
FIG. 14 is a cross-sectional view along line BB-BB of FIG. 13, showing a beam steering effect when the output of the laser device is directed through a lens.

The beam steering effect is illustrated in FIGS. 13 and 14. By individually controlling the segments 804, the laser output of the PCSEL device 800 can be centred at different positions in the plane of the photonic crystal. FIG. 13 illustrates three different exemplary positions (A, B and C) at which the laser output of the laser device 800 can be centred, by individually controlling the segments 804. These positions are intended to be illustrative, and non-limiting.

FIG. 14 shows a cross-section along line BB-BB of FIG. 13, and a path that laser light emitted from points A, B and C would take if allowed to pass through a lens 900 focused at B. The light from these three points is transmitted and refracted by the lens 900. FIG. 14 shows the path of light from point A to point A', point B to B', and point C to C', points A', B' and C' being in plane 902. Hence, by controlling the laser output to be centred at one of points A, B or C, beam steering can be achieved.

The inventors have also found that this fine-tuning of the lasing output can be used to compensate for variations in device performance brought about by manufacturing issues for each individual PCSEL element. For example, deleterious effects on the lasing output caused by inaccuracies in the photonic crystal structure, heatsinking, and other manufacturing issues, can be compensated for by fine-tuning the feedback using the segmented contacts, e.g. to achieve higher single mode lasing power outputs.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

All references referred to above and/or listed below are hereby incorporated by reference in their entirety.

REFERENCES

[1] M. Imada, S. Noda, A. Chutinan, T. Tokuda, M. Murata and G. Sasaki, "Coherent two-dimensional lasing action in surface-emitting laser with triangular-lattice photonic crystal structure," Applied Physics Letters, vol. 75, no. 3, p. 316, 1999.

[2] D. Ohnishi, T. Okano, M. Imada and S. Noda, "Room temperature continuous wave operation of a surface emitting two dimensional photonic crystal laser," optics express, vol. 12, no. 8, p. 1562, 2004.

[3] E. Miyai, K. Sakai, T. Okano, W. Kunishi, D. Ohnishi and S. Noda, "Lasers producing tailored beams," Nature, vol. 441, no. 946, 2006.

[4] S. Noda, M. Yokoyama, A. Chutinan, M. Imada and M. Mochizuki, "Polarization Mode Control of Two-Dimensional Photonic Crystal Laser by Unit Cell Structure Design," Science, vol. 293, p. 1123, 2001.

[5] Y. Kurosaka, S. Iwahashi, Y. Liang, K. Sakai, E. Miyai, W. Kunishi, D. Ohnishi and S. Noda, "On-chip beam-steering photonic-crystal lasers," Nature Photonics, vol. 4, pp. 447-450, 2010.

[6] K. Hirose, Y. Liang, Y. Kurosaka, A. Watanabe, T. Sugiyama and S. Noda, "Watt-class high-power, high-beam-quality photonic-crystal lasers," Nature Photonics, vol. 8, pp. 406-411, 2014.

[7] D. Williams, K. Groom, D. Childs, R. Taylor, S. Khamas, R. Hogg, B. Stevens, N. Ikeda and Y. Sugimoto, "Epitaxially regrown GaAs-based photonic crystal surface emitting laser," Photonics Technology Letters, vol. 24, no. 11, pp. 966-968, 2012.

[8] D. Williams, K. Groom, D. Childs, R. Taylor, S. Khamas, R. Hogg, B. Stevens, N. Ikeda and Y. Sugimoto, "Optimisation of coupling between photonic crystal and active elements in an epitaxially regrown GaAs based photonic crystal surface emitting laser," Japanese Journal of Applied Physics, vol. 52, no. 02BG05-1-3, 2012.

[9] R. Taylor, D. Williams, D. Childs, B. Stevens, L. Shepherd, S. Khamas, K. Groom and R. Hogg, "All-semiconductor photonic crystal surface emitting lasers based on epitaxial regrowth," IEEE Journal of Selected Topics in Quantum Electronics, vol. 19, no. 4, p. 4900407, 2013.

[10] M. Nishimoto, K. Ishizaki, K. Maekawa, K. Kitamur and S. Noda, "Air-Hole Retained Growth by Molecular Beam Epitaxy for Fabricating GaAs-Based Photonic-Crystal Lasers," Applied physics express, vol. 6, no. 4, 2013.

[11] R. Taylor, D. Child, P. Ivanov, B. Stevens, N. Babazadeh, A. Crombie, S. T. G. Ternent, H. Zhou and R. Hogg, "Electronic control of coherence in a two-dimensional array of photonic crystal surface emitting lasers," Nature Scientific Reports, vol. 5, p. 13203, 2015.

[12] R. Taylor, D. Childs, P. Ivanov, B. Stevens, N. Babazadeh, J. Sarma, S. Khamas, Crombie, G. Li, G. Ternent, S. Thoms, H. Zhou and R. Hogg, "Coherently Coupled Photonic Crystal Surface Emitting Laser Array," Journal of selected topics in quantum electronics, vol. 21, no. 6, p. 4900307, 2015.

[13] S. Noda, T. Sakaguchi, W. Kunishi, S. Arimura, K. Nagase, E. Miyai, D. Ohnishi and K. Sakai, "Surface-Emitting Photonic-Crystal Laser with 35 W Peak Power," in Conference on Lasers and Electro-Optics (CLEO) and the International Quantum ElectronicsConference (IQEC), 2009.

[14] R. J. E. Taylor, D. M. Williams, J. R. Orchard, D. T. Childs, S. Khamas and R. Hogg, "Band structure and waveguide modelling of epitaxially regrown photonic crystal surface emitting lasers," Journal of Physics D, vol. 46, no. 26, p. 264005, 2013.

[15] J. GELLETA., Y. LIANG., H. KITAGAWA. and S. NODA., "Influence of external reflection on the TE mode of photonic crystal surface-emitting lasers," Journal of the Optical Society of America B, vol. 32, no. 7, p. 1435, 2015.

[16] Y. Chassagneux, R. Colombell, W. Maineult, S. Barbieri, H. E. Beere, D. A. Ritchie, S. Khanna, E. H. Linfield and A. Davies, "Electrically pumped photonic-crystal terahertz lasers controlled by boundary conditions," Nature, vol. 457, pp. 174-178, 2009.

[17] S. G. Johnson and J. D. Joannopoulos, "Block-iterative frequency-domain methods for Maxwell's equations in a planewave basis," optics express, vol. 8, no. 3, pp. 173-190, 2001.

[18] M. Yokoyama and S. Noda, "Polarisation mode control of two-dimensional photomic crystal laser having a square lattice structure," IEEE journal of quantum electronics, vol. 39, no. 9, p. 1074, 2003.

[19] Y. Kurosaka, S. Iwahashi, K. Sakai, E. Miyai, W. Kunishi, D. Ohnishi and S. Noda, "Band structure observation of 2D photonic crystal with various v shaped air hole arrangements," IEICE Electronics express, vol. 6, no. 13, p. 966, 2009.

[20] R. Taylor, E. James, D. Childs, "Improved Laser Structure", WO2016/027105 A1

The invention claimed is:

1. A laser device having:
a photonic crystal surface emitting laser (PCSEL) element, there being provided at least at a first lateral side of the PCSEL element a reflector arranged to reflect back into the PCSEL element at least a portion of light travelling out of the PCSEL element through the first lateral side of the PCSEL element, there being interposed between the first lateral side of the PCSEL element and the reflector an electrically controllable light-transmission region configured to control the transmission of light from the PCSEL element to the reflector, based on an electrical input, and wherein the PCSEL element comprises an active layer and a photonic crystal layer, wherein the photonic crystal layer comprises a two dimensional periodic lattice structure formed in-plane within the photonic crystal layer,
there further being provided at a second lateral side of the PCSEL element a second reflector arranged to reflect back into the PCSEL element at least a portion of light travelling out of the PCSEL element through the second lateral side of the PCSEL element.

2. The laser device of claim 1, wherein the reflector is a wavelength-selective reflector.

3. The laser device of claim 1, wherein the electrically controllable light-transmission region is switchable by the electrical input between a transmission state in which all light is transmitted through it to be reflected by a corresponding reflector, and an extinction state in which no light is transmitted through it, thereby controlling the transmission of light from the PCSEL element to the reflector.

4. The laser device of claim 1, there being interposed between the second lateral side of the PCSEL element and the second reflector, a second electrically controllable light-transmission region configured to control the transmission of light from the PCSEL element to the second reflector, based on an electrical input.

5. The laser device of claim 4, wherein each electrically controllable light-transmission region is independently controlled by a respective electrical input.

6. The laser device of claim 1, wherein the first and second lateral sides are adjacent to each other.

7. The laser device of claim 1, wherein respective reflectors are provided at first, second, third and fourth lateral sides of the PCSEL element, each respectively arranged to reflect back into the PCSEL element at least a portion of the light travelling out of the PCSEL element through the respective lateral sides of the PCSEL element.

8. The laser device of claim 7, wherein a respective electrically controllable light-transmission region is interposed between each respective reflector and lateral side of the laser device.

9. The laser device of claim 1, wherein at least one electrically controllable light-transmission region is split into at least two segments, each segment configured to control the transmission of a respective portion of light from the PCSEL element to the reflector.

10. The laser device of claim 9, wherein each segment is individually controlled by a respective electrical input.

11. A method for operating a laser device, the laser device having a photonic crystal surface emitting laser (PCSEL) element, the method including the step of controlling the reflection of light, travelling out of the PCSEL element through a first lateral side of the PCSEL element, back into the PCSEL element, by causing an electrical input to control the transmission of light through a light-transmission region interposed between the first lateral side of the PCSEL element and a reflector, wherein the PCSEL element comprises an active layer and an photonic crystal layer, wherein the photonic crystal layer comprises a two dimensional periodic lattice structure formed in-plane within the photonic crystal layer,
there further being provided at a second lateral side of the PCSEL element a second reflector arranged to reflect back into the PCSEL element at least a portion of light travelling out of the PCSEL element through the second lateral side of the PCSEL element.

* * * * *